(12) United States Patent
Asai

(10) Patent No.: US 8,411,549 B2
(45) Date of Patent: Apr. 2, 2013

(54) CIRCUIT FOR PREVENTING DESTRUCTION OF SEMICONDUCTOR LASER ELEMENT, AND OPTICAL DISC DEVICE PROVIDED WITH THE CIRCUIT

(75) Inventor: Tsutomu Asai, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 13/449,740

(22) Filed: Apr. 18, 2012

(65) Prior Publication Data

US 2012/0300605 A1 Nov. 29, 2012

(30) Foreign Application Priority Data

May 24, 2011 (JP) .................................. 2011-116148

(51) Int. Cl.
*G11B 7/00* (2006.01)
(52) U.S. Cl. .................. 369/116; 369/44.32; 369/53.26
(58) Field of Classification Search .................. None
See application file for complete search history.

(56) References Cited

U.S. PATENT DOCUMENTS 5,666,045 A * 9/1997 Grodevant ................... 323/282
6,108,114 A * 8/2000 Gilliland et al. .............. 398/195
7,339,870 B2 * 3/2008 Hori et al. ..................... 369/116

FOREIGN PATENT DOCUMENTS

JP 2004-355697 12/2004

* cited by examiner

*Primary Examiner* — Muhammad N Edun
(74) *Attorney, Agent, or Firm* — Morgan, Lewis & Bockius LLP

(57) ABSTRACT

A circuit for preventing destruction of a semiconductor laser element of an optical disc device comprises a light-emission-directing circuit part for outputting a light-emission-directing signal for directing the semiconductor laser element to emit light; a voltage-monitoring circuit part for monitoring a light-emitting voltage and, when a judgment is made that the light-emitting voltage is normal, outputting a light-emission-permitting signal for permitting the semiconductor laser element to emit light, the light-emitting voltage being supplied from a power source for the semiconductor laser element to an optical-output-controlling circuit part in order to cause the semiconductor laser element to emit light; and a light-emission-permitting circuit part for using the optical-output-controlling circuit part to cause the semiconductor laser element to emit light only when the light-emission-directing signal and the light-emission-permitting signal are inputted.

6 Claims, 3 Drawing Sheets

CIRCUIT FOR PREVENTING DESTRUCTION OF SEMICONDUCTOR LASER ELEMENT, AND OPTICAL DISC DEVICE PROVIDED WITH THE CIRCUIT

This application is based upon and claims the benefit of priority from the corresponding Japanese Patent Application No. 2011-116148, filed May 24, 2011, the entire contents of which are incorporated herein by reference.

BACKGROUND OF THE INVENTION

1. Field of the Invention

The present invention relates to a circuit for preventing destruction of a semiconductor laser element, where the circuit is provided with functions for controlling optical output of the semiconductor laser element. The present invention also relates to an optical disc device provided with the circuit.

2. Description of Related Art

Conventional optical disc devices for using laser light outputted from a semiconductor laser element installed on an optical pickup to record information on DVDs or other optical discs (optical-disc recording media) and play back the information recorded on the optical disc are widely used.

In such an optical disc device, the optical output of the semiconductor laser element is adjusted to a constant level by an automatic power control (APC) function. FIG. 3 is a configuration diagram that shows an example of a conventional optical disc device. As shown in FIG. 3, a conventional optical disc device 100 is provided with an optical pickup part 110, an LD driver 121 having APC functionality, an LD power source 122, an LD-driver power source 123, a switch circuit part 124, a control circuit part 130, a playback signal-processing circuit part 140, and an audio-visual output part 150. The optical pickup part 110 has a laser diode (LD) 111, a beam splitter 112, and a photodiode (PD) 113. The LD power source 122 supplies a light-emitting voltage VLD for causing the LD 111 to emit light. The LD-driver power source 123 drives the LD driver 121.

The laser light shone from the LD 111 is led by the beam splitter 112 to an optical disc 200 that is set in the optical disc device 100. Optical spots are thereby formed by the laser light on the optical disc 200. The laser light reflected by the optical disc 200 is led to the PD 113 by the beam splitter 112. The PD 113 performs a photoelectric conversion on the reflected laser light and generates an electrical signal containing information recorded on the optical disc 200 for playback. A video signal and an audio signal are generated by the playback signal-processing circuit part 140 on the basis of this electrical signal. The audio-visual output part 150 is used to implement a video display on the basis of the video signal and to implement audio output on the basis of the audio signal.

The electrical signal generated by the PD 113 is also inputted to the LD driver 121. The LD driver 121 adjusts the light-emitting electrical current provided to the LD 111 using feedback control on the basis of the inputted electrical signal, and to the extent possible limits fluctuations in the optical output of the LD 111.

However, when the light-emitting voltage VLD supplied to the LD driver 121 fluctuates faster than the response speed of this feedback control, the optical output control is unable to respond to the voltage fluctuations. In such instances, the optical output control of the LD driver 121 runs out of control, and the LD 111 is destroyed.

In cases where the optical disc device 100 is, e.g., a top-loading system (clam-shell type), the starting/stopping of light emission by the LD 111 must be associated with the opening and closing of the disc cover. When the disc cover is closed, a sensor switch is depressed, the switch circuit part 124 switches on the connection between the LD driver 121 and the LD power source 122, and the LD 111 can emit light. In this optical disc device 100, the disc cover may momentarily separate from the sensor switch when vibrations are applied during illumination of the LD 111. In such cases, the switch circuit part 124 momentarily switches off the connection between the LD driver 121 and the LD power source 122 in association with this momentary separation. The voltage supplied to the LD driver 121 is therefore momentarily lower than a light-emitting voltage threshold of the LD 111. When the LD 111 stops emitting light, the LD driver 121 sets the optical output of the LD 111 to an extremely high value. However, when the light-emitting voltage VLD is then immediately supplied to the LD driver 121, the optical output of the LD 111 is still set to an extremely high level, and therefore excessive electrical power is supplied to the LD 111, and the LD 111 is destroyed.

In response to this phenomenon, in Japanese Laid-Open Patent Application No. 2004-355697, when the driving current of the LD exceeds a permitted value, a current limiter stops the increase in driving current, and the magnitude of the driving current of the LD is limited so as to be less than or equal to a constant value, whereby destruction of the LD is prevented. However, even in Japanese Laid-Open Patent Application No. 2004-355697, when the driving current increases faster than the response speed of the current limiter, and the permissible value is exceeded, increases in the driving current cannot be stopped, and the LD is destroyed.

SUMMARY OF THE INVENTION

The present invention was devised in light of the aforementioned problems, and it is an object thereof to provide a circuit for preventing destruction of the semiconductor laser element and an optical disc device provided with this circuit, the circuit being capable of preventing destruction of the semiconductor laser element due to abnormal light-emitting voltages.

In order to achieve the aforedescribed object, a circuit for preventing destruction of a semiconductor laser element according to an aspect of the present invention comprises a light-emission-directing circuit part for outputting a light-emission-directing signal for directing the semiconductor laser element to emit light; a voltage-monitoring circuit part for monitoring a light-emitting voltage and, when a judgment is made that the light-emitting voltage is normal, outputting a light-emission-permitting signal for permitting the semiconductor laser element to emit light, the light-emitting voltage being supplied from a power source for the semiconductor laser element to an optical-output-controlling circuit part in order to cause the semiconductor laser element to emit light; and a light-emission-permitting circuit part for using the optical-output-controlling circuit part to cause the semiconductor laser element to emit light only when the light-emission-directing signal and the light-emission-permitting signal are inputted.

According to the aforedescribed configuration, the semiconductor laser element is made to emit light only when the light-emission-directing signal and the light-emission-permitting signal are inputted to the light-emission-permitting circuit part. The light-emission-permitting circuit part therefore immediately uses the optical-output-controlling circuit part to stop the semiconductor laser element from emitting light in cases where the voltage-monitoring circuit part judges that the light-emitting voltage is abnormal, even when, e.g., the light-emission-directing circuit part has directed the semiconductor laser element to emit light in order to write information to an optical disc or read information from the optical disc. The optical-output control of the semiconductor laser element can therefore be prevented from becoming unmanageable, and destruction of the semiconductor laser element can be prevented.

The aforedescribed configuration may also be such that the voltage-monitoring circuit part outputs the light-emission-permitting signal when a judgment is made that at least one of a voltage value of the light-emitting voltage and a magnitude of a fluctuation component of the voltage value is normal.

According to this configuration, the light-emission-permitting circuit part immediately uses the optical-output-controlling circuit part to stop the semiconductor laser element from emitting light in cases where voltage-monitoring circuit part judges that at least one of the voltage value of the light-emitting voltage and the magnitude of the fluctuation component is abnormal, even when, e.g., the light-emission-directing circuit part has directed the semiconductor laser element to emit light. The optical-output control of the semiconductor laser element can therefore be prevented from becoming unmanageable, and destruction of the semiconductor laser element can be prevented, even when the voltage value of the light-emitting voltage supplied from the power source for the semiconductor laser element suddenly fluctuates more rapidly than the response speed of the optical output control of the optical-output-controlling circuit part.

The aforedescribed configuration may also be such that the light-emission-permitting circuit part comprises a first rectifier element, a cathode of the first rectifier element being connected to an output end of the light-emission-directing circuit part; at least one second rectifier element, a cathode of the second rectifier element being connected to an output end of the voltage-monitoring circuit part; and a standard power source for imparting a standard potential to anodes of the first and second rectifier elements via a pull-up resistor element, wherein the anodes of the first and second rectifier elements are connected to the optical-output-controlling circuit part; the light-emission-directing circuit part causes the first rectifier element to be conductive when the semiconductor laser element is directed to stop emitting light; and the voltage-monitoring circuit part causes the second rectifier element to be conductive when a judgment is made that at least one of the voltage value of the light-emitting voltage and the magnitude of the fluctuation component is abnormal. According to this configuration, the light-emission-permitting circuit part can be implemented using a simple configuration.

The aforedescribed configuration may also be such that the light-emission-directing circuit part and at least one part of the voltage-monitoring circuit part is provided to a single microcomputer. According to this configuration, a microcomputer can be used to direct the semiconductor laser element to emit light and to monitor the light-emitting voltage, and therefore manufacturing costs can be reduced.

The aforedescribed configuration may also be such that the voltage-monitoring circuit part judges that the voltage value of the light-emitting voltage is normal when the voltage value of the light-emitting voltage is greater than or equal to a minimal operating voltage value required to cause the semiconductor laser element to emit light. According to this configuration, the optical-output-controlling circuit part does not set an extremely high optical output even when the light-emitting voltage fluctuates and becomes smaller than the minimal operating voltage value required for the semiconductor laser element to emit light (i.e., lower than a light-emission voltage threshold), and the semiconductor laser element stops emitting light. The optical output control of the semiconductor laser element can therefore be prevented from becoming unmanageable due to instantaneous interruptions or other abnormalities in the light-emitting voltage, and destruction of the semiconductor laser element can be prevented.

An optical disc device according to an aspect of the present invention comprises an optical pickup part having a semiconductor laser element; an optical-output-controlling circuit part for controlling an optical output of the semiconductor laser element; a power source for the semiconductor laser element, the power source supplying to the optical-output-controlling circuit part a light-emitting voltage for causing the semiconductor laser element to emit light; and a circuit for preventing destruction of the semiconductor laser element. The circuit for preventing destruction of the semiconductor laser element has a light-emission-directing circuit part for outputting a light-emission-directing signal for directing the semiconductor laser element to emit light; a voltage-monitoring circuit part for monitoring the light-emitting voltage and, when a judgment is made that the light-emitting voltage is normal, outputting a light-emission-permitting signal for permitting the semiconductor laser element to emit light, the light-emitting voltage being supplied from the power source for the semiconductor laser element to the optical-output-controlling circuit part in order to cause the semiconductor laser element to emit light; and a light-emission-permitting circuit part for using the optical-output-controlling circuit part to cause the semiconductor laser element to emit light only when the light-emission-directing signal and the light-emission-permitting signal are inputted.

According to the aforedescribed configuration, the circuit for preventing destruction of the semiconductor laser element immediately uses the optical-output-controlling circuit part to stop the semiconductor laser element from emitting light, even when the light-emitting voltage supplied from the power source for the semiconductor laser element suddenly fluctuates more rapidly than the response time of the optical output control performed by the optical-output-controlling circuit part. The optical-output control of the semiconductor laser element can therefore be prevented from becoming unmanageable, and destruction of the semiconductor laser element can be prevented.

The optical output control is prevented from becoming unmanageable, and therefore the light-detecting functions of the optical pickup part function normally, and the optical pickup part can be driven normally. Therefore, problems such as the optical pickup part impacting the reflective surface of the optical disc can be prevented, injury to the reflective surface of the optical disc can be prevented, and damage to the member having the optical pickup part (e.g., an objective lens) can be prevented.

DETAILED DESCRIPTION OF PREFERRED EMBODIMENTS

Figure 1:
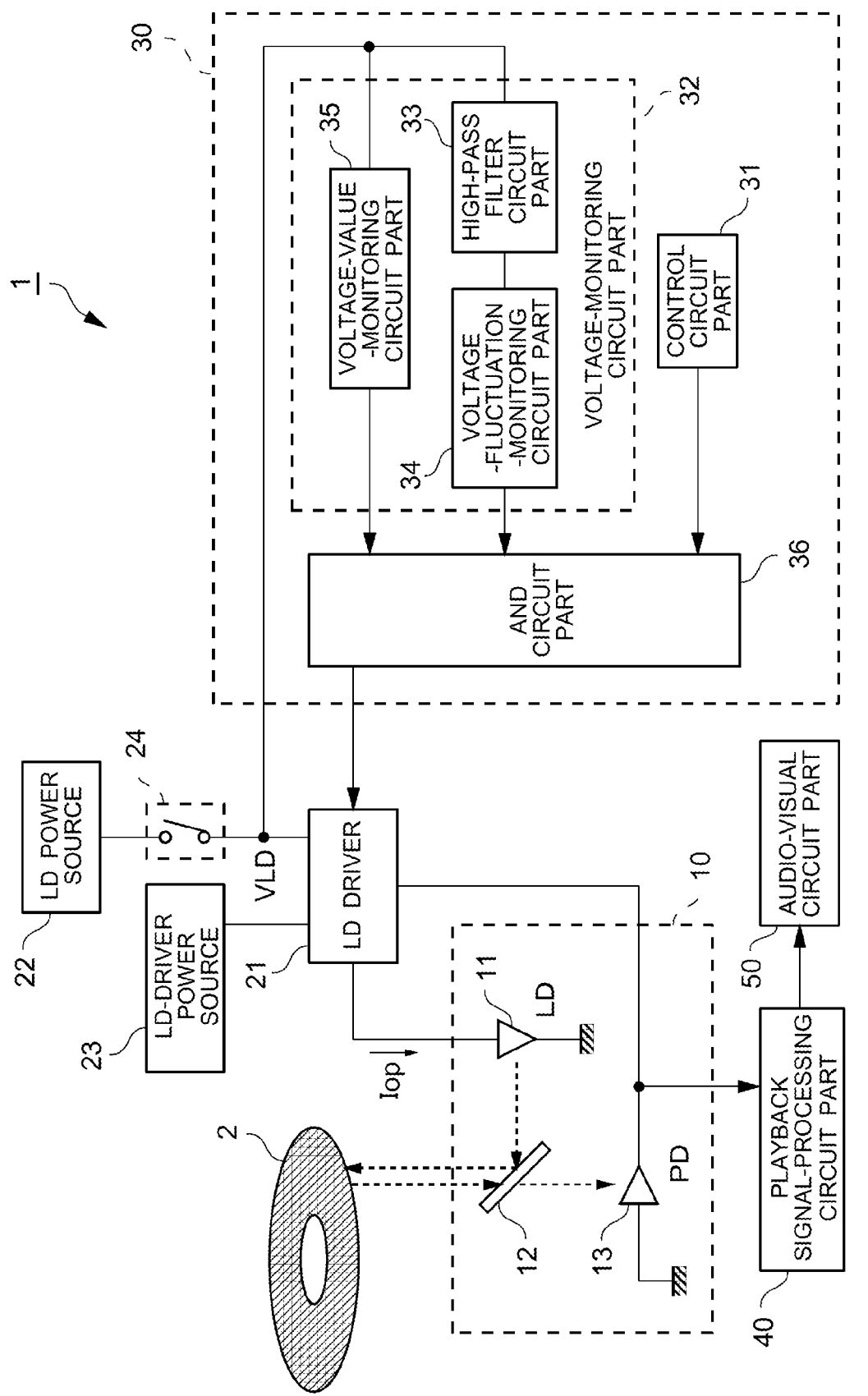
FIG. 1 is a configuration diagram of an optical disc device according to an embodiment of the present invention.

An optical disc device 1 according to an embodiment of the present invention will be described below with reference to the drawings. FIG. 1 is a configuration diagram of an optical disc device according to an embodiment of the present invention. The optical disc device 1 is provided with an optical pickup part 10, an LD driver 21 (optical-output-controlling circuit part), an LD power source 22, an LD-driver power source 23, a switch circuit part 24, an LD-destruction-preventing circuit 30 (circuit for preventing destruction of a semiconductor laser element), a playback signal-processing circuit part 40, and an audio-visual output part 50, as shown in FIG. 1.

The optical pickup part 10 has a laser diode 11 (semiconductor laser element), a beam splitter 12, and a photodiode 13. The laser diode will be referred to as "LD" below, and the photodiode will be referred to as "PD." The laser light emitted from the LD 11 is led by the beam splitter 12 to an optical disc 2 that is set in the optical disc device 1. Optical spots are thereby formed on the optical disc 2 by the laser light. The types of the optical disc 2 that are relevant are, e.g., Blu-Ray Disc (BD), Digital Versatile Disc (DVD), Compact Disc (CD), or other optical-disc recording media, but these examples are not given by way of limitation.

The laser light that is reflected by the optical disc 2 (referred to as "reflected light" below) is led to the PD 13 by the beam splitter 12. The PD 13 performs a photoelectric conversion on the received reflected light and generates an electric-current signal having a magnitude that corresponds to the strength of the reflected light. The electric-current signal generated by the PD 13 may also be converted by a predetermined converting circuit to an electrical-voltage signal that corresponds to the magnitude of the electric-current signal. In any case, a photoelectric conversion signal (the electric-current signal or the electric-voltage signal) having a magnitude corresponding to the strength of the reflected light is generated by the optical pickup part 10. The photoelectric conversion signal generated by the optical pickup part 10 is inputted to both the playback signal-processing circuit part 40 and the LD driver 21.

The playback signal-processing circuit part 40 processes the photoelectric conversion signal in various ways (demodulation and the like) and generates a video signal and an audio signal that are based on the photoelectric conversion signal. These signals are inputted to the audio-visual output part 50, which has a display and speakers. This input is used to implement a video display on the basis of the video signal and audio output on the basis of the audio signal (i.e., to play back the information recorded on the optical disc 2). The playback format resulting from the optical disc device 1 is not limited to the above descriptions and may be configured as, e.g., only one of a video display and audio output.

The photoelectric conversion signal represents the strength of the reflected light and therefore contains information concerning the optical output of the laser light emitted by the LD 11 in addition to containing information read from the optical disc 2. The optical disc device 1 accordingly also makes use of the photoelectric conversion signal as a feedback control signal used to control the optical output of the laser light emitted by the LD 11.

The LD driver 21 has automatic power control (APC) functionality for adjusting the electrical power supplied to the LD 11 so that the optical output of the LD 11 stays at a constant level. On the basis of the photoelectric conversion signal inputted from the PD 13, the LD driver 21 adjusts a driving current Top for supplying power to the LD 11 and executes feedback control so that the optical output of the LD 11 stays at a constant level. In cases where the voltage value of photoelectric conversion signal inputted from the PD 13 is larger than a standard voltage value, which is set in advance, the optical output of the LD 11 is larger than the constant level. The LD driver 21 therefore performs feedback control on the LD 11 so as to reduce the optical output of the laser light. In cases where the voltage value of the photoelectric conversion signal is smaller than the standard voltage value, the optical output of the LD 11 is smaller than the constant value. The LD driver 21 therefore performs feedback control on the LD 11 so as to increase the optical output of the laser light. As a result, the optical output of the laser light is adjusted so that the voltage value of the photoelectric conversion signal approaches the standard voltage value.

The LD driver 21 supplies a light-emitting voltage VLD, which is supplied from the LD power source 22, to the LD 11 as a driving voltage on the basis of a light-emission control signal inputted from the LD-destruction-preventing circuit 30 and causes the LD 11 to emit light, or stops the supply of the light-emitting voltage VLD to the LD 11 and stops the LD 11 from emitting light. The LD driver 21 supplies driving power to the LD 11 and causes light emission when the voltage value of the light-emission control signal inputted from the LD-destruction-preventing circuit 30 is greater than or equal to a driving threshold Vd that is determined in advance. On the other hand, when the voltage value of the light-emission control signal inputted from the LD-destruction-preventing circuit 30 is less than the driving threshold Vd that was determined in advance, the LD driver 21 stops supplying driving power to the LD 11 and stops the LD 11 from emitting light. The driving threshold Vd of the LD driver 21 is set to be, e.g., less than or equal to a standard voltage Vr, described below.

The LD power source 22 supplies the light-emitting voltage VLD to the LD driver 21 and connects to the LD driver 21 via the switch circuit part 24. The LD-driver power source 23 supplies electrical power for driving to the LD driver 21.

The switch circuit part 24 switches on and off the electrical connection between the LD power source 22 and the LD driver 21. The switch circuit part 24, e.g., acts in concert with a sensor or the like for detecting the opening and closing of a disc tray, disc cover, or the like for loading the optical disc 2 in the optical disc device 1. When the disc tray, disc cover, or the like is open, the switch circuit part 24 turns off the electrical connection between the LD power source 22 and the LD driver 21 so that the light-emitting voltage VLD is not supplied to the LD driver 21. When the disc tray, disc cover, or the like is closed, the switch circuit part 24 turns on the electrical connection between the LD power source 22 and the LD driver 21 so that the light-emitting voltage VLD is supplied to the LD driver 21.

The LD-destruction-preventing circuit 30 then constantly monitors the value of the light-emitting voltage VLD that is supplied from the LD power source 22 to the LD driver 21. The LD-destruction-preventing circuit 30 outputs to the LD driver 21 the light-emission control signal for controlling the starting and stopping of light emission by the LD 11 (i.e., for controlling whether or not driving power is supplied to the LD 11). In cases where the voltage value of the light-emitting voltage VLD has increased to an excessive degree, or where instantaneous interruptions or other sudden voltage fluctuations are produced in the light-emitting voltage VLD, the LD-destruction-preventing circuit 30 uses the light-emission control signal outputted to the LD driver 21 to stop the supply of driving power from the LD driver 21 to the LD 11 and stop the LD 11 from emitting light.

The LD-destruction-preventing circuit 30 has a control circuit part 31 (light-emission-directing circuit part), a voltage-monitoring circuit part 32, and an AND circuit part 36 (light-emission-permitting circuit part), as shown in FIG. 1.

The control circuit part 31 directs the starting and stopping of light emission by the LD 11. When, e.g., the LD 11 is made to emit light in order to write information on the optical disc 2 or read information from the optical disc 2, the control circuit part 31 outputs to the AND circuit part 36 a first directing signal (light-emission-directing signal) for directing light emission of the LD 11.

The voltage-monitoring circuit part 32 constantly monitors for abnormalities in the light-emitting voltage VLD supplied from the LD power source 22 to the LD driver 21 for causing the LD 11 to emit light. When a judgment is made that at least one of the voltage value of the light-emitting voltage VLD and the magnitude of a fluctuation component ΔVLD thereof is normal, the voltage-monitoring circuit part 32 outputs a light-emission-permitting signal that permits the LD 11 to emit light. The voltage-monitoring circuit part 32 has a high-pass filter circuit part 33, a voltage-fluctuation-monitoring circuit part 34, and a voltage-value-monitoring circuit part 35, as shown in FIG. 1.

The high-pass filter circuit part 33 is connected to a conductive pathway between the LD driver 21 and the switch circuit part 24. The high-pass filter circuit part 33 extracts the fluctuation component ΔVLD of the voltage value of the light-emitting voltage VLD and outputs to the voltage-fluctuation-monitoring circuit part 34. In particular, the high-pass filter circuit part 33 should be able to extract the fluctuation component ΔVLD, which corresponds to voltage fluctuations, more quickly than the response speed of the optical output control of the LD 11 as performed by the LD driver 21.

The voltage-fluctuation-monitoring circuit part 34 constantly monitors whether or not the magnitude of the fluctuation component ΔVLD is less than or equal to a fluctuation threshold ΔVs (first threshold) that is set in advance. When the magnitude of the fluctuation component ΔVLD is less than or equal to the fluctuation threshold ΔVs, the voltage-fluctuation-monitoring circuit part 34 outputs to the AND circuit part 36 a first fluctuation signal (one of the light-emission-permitting signals) for permitting the LD 11 to emit light.

The voltage-value-monitoring circuit part 35 is connected to a conductive pathway between the LD driver 21 and the switch circuit part 24. The voltage-value-monitoring circuit part 35 constantly monitors whether or not the value of the light-emitting voltage VLD supplied to the LD driver 21 is greater or equal to a voltage threshold Vop (second threshold) that is determined in advance. The voltage threshold Vop is the minimal operational voltage value (i.e., light-emission voltage threshold) required for the LD 11 to emit light. When the value of the light-emitting voltage VLD is greater than or equal to the voltage threshold Vop, the voltage-value-monitoring circuit part 35 outputs to the AND circuit part 36 a first voltage-value signal (one of the light-emission-permitting signals) for permitting the LD 11 to emit light.

The AND circuit part 36 outputs to the LD driver 21 the light-emission control signal for causing the LD 11 to emit light only when the first directing signal, the first voltage-value signal, and the first fluctuation signal are all inputted, and causes the LD driver 21 to cause the LD 11 to emit light.

Figure 2:
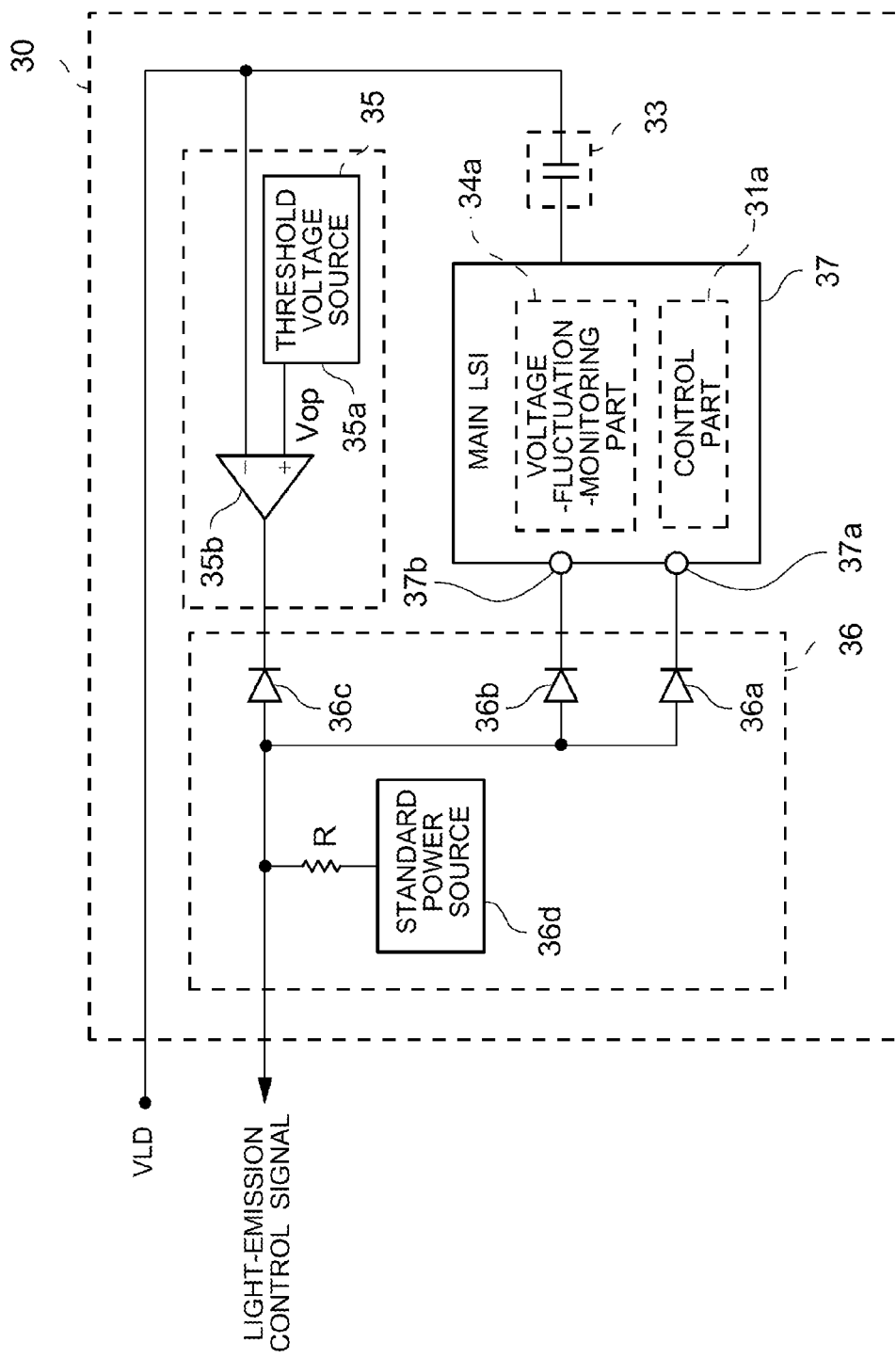
FIG. 2 is a configuration diagram for depicting the details of the LD-destruction-preventing circuit according to an embodiment of the present invention.
Figure 3:
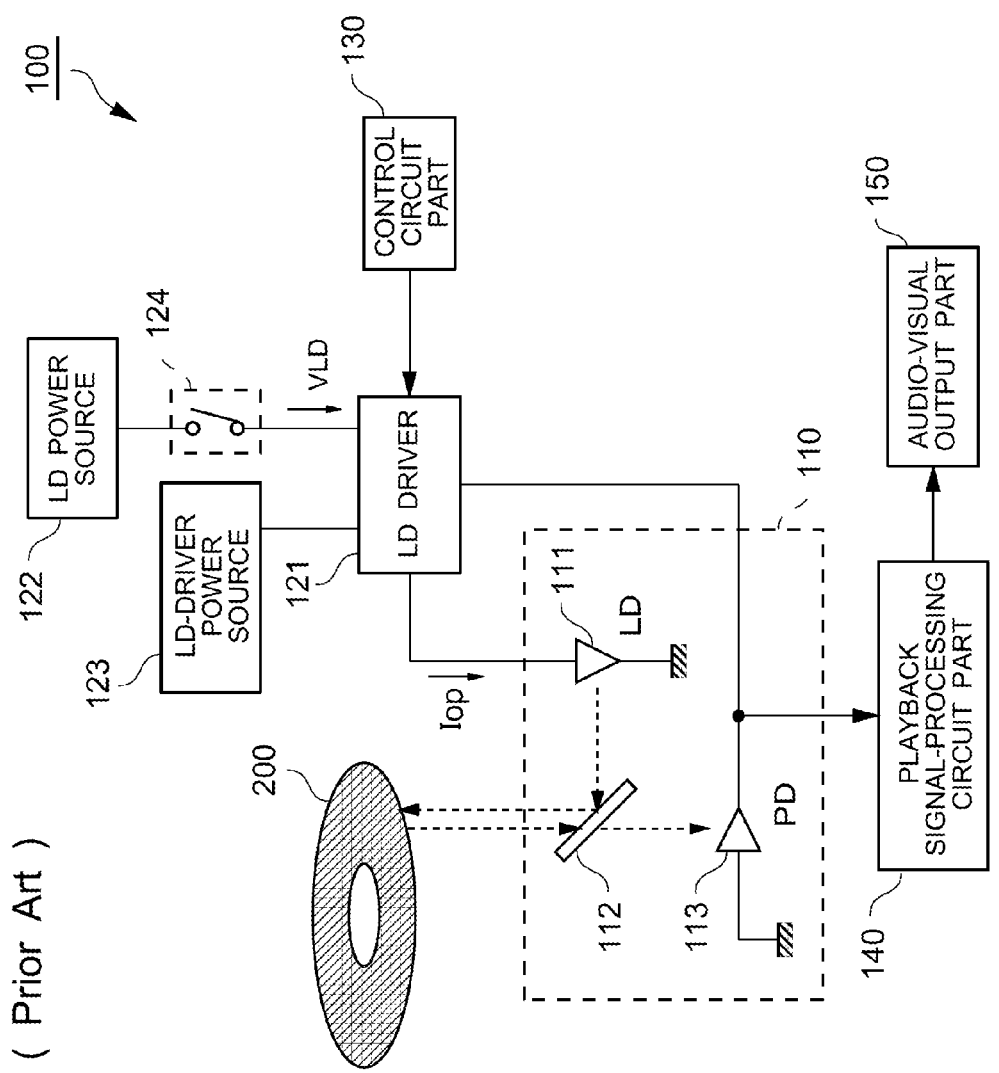
FIG. 3 is a configuration diagram that shows an example of a conventional optical disc device.

The specifics of the LD-destruction-preventing circuit 30 according to the present embodiment will described next. FIG. 2 is a configuration diagram that depicts the details of the LD-destruction-preventing circuit according to the embodiment of the present invention.

As shown in FIG. 2, the control circuit part 31 and at least a part (the voltage-fluctuation-monitoring circuit part 34) of the voltage-monitoring circuit part 32 are provided to a single main LSI 37 (e.g., a microcomputer). In other words, the main LSI 37 has a control part 31a (light-emission-directing part) that functions as the control circuit part 31 and a voltage-fluctuation-monitoring part 34a that functions as the voltage-fluctuation-monitoring circuit part 34. When, e.g., the LD 11 is made to emit light in order to write information to the optical disc 2 or read information from the optical disc 2, the control part 31a of the main LSI 37 outputs the first directing signal (light-emission-directing signal) for directing the LD 11 to emit light. When magnitude of the fluctuation component ΔVLD of the light-emitting voltage VLD is less than or equal to the fluctuation threshold ΔVs (first threshold), which is set in advance, the voltage-fluctuation-monitoring part 34a outputs to the AND circuit part 36 the first fluctuation signal (one of the light-emission-permitting signals) for permitting the LD 11 to emit light.

The main LSI 37 makes use of the control part 31a and outputs the first directing signal (light-emission-directing signal) having a voltage value V1 from a first output terminal part 37a when the LD 11 is made to emit light. A second directing signal having a voltage value V2 is output from the first output terminal part 37a when the LD 11 is not being made to emit light. [These outputs] are not given by way of limitation, and fluctuation signals (i.e., the first fluctuation signal and a second fluctuation signal) and directing signals (i.e., the first directing signal and the second directing signal) may also be output from the same output terminal part.

When the magnitude of the fluctuation component ΔVLD of the light-emitting voltage VLD is less than or equal to the fluctuation threshold ΔVs (the first threshold), which is set in advance, the main LSI 37 makes use of the voltage-fluctuation-monitoring part 34a and outputs the first fluctuation signal (one of the light-emission-permitting signals) having the voltage value V1 from a second output terminal part 37b. When the magnitude of the fluctuation component ΔVLD is larger than the fluctuation threshold ΔVs that is set in advance, the main LSI 37 outputs a second fluctuation signal having the voltage value V2 from the second output terminal part 37b. The fluctuation threshold ΔVs may also be a fixed value that is set during manufacturing or upon factory shipping. Alternatively, [the fluctuation threshold] may be a value for which the setting can be changed using an input part (not shown). In such instances, the optical disc device 1 is provided with an input part for performing operations to change the setting of the fluctuation threshold ΔVs.

A capacitor is used as the high-pass filter circuit part 33 in the present embodiment, but this is not given by way of limitation. The high-pass filter circuit part 33 should be capable of extracting the fluctuation component ΔVLD of the voltage value of the light-emitting voltage VLD from the light-emitting voltage. For example, a differentiation circuit may be also used for the high-pass filter circuit part 33.

The voltage-value-monitoring circuit part 35 has a threshold voltage source 35a and a comparator 35b (comparison circuit part). The threshold voltage source 35a supplies to the comparator 35b a reference voltage having [the value of] the constant voltage threshold Vop (second threshold), which is set in advance. The voltage threshold Vop is set to the same value as the minimum operating voltage value required for the LD 11 to emit light (i.e., the light-emission voltage threshold). The light-emitting voltage VLD and the reference voltage are inputted to the comparator 35b. When the value of the light-emitting voltage VLD is greater than or equal to the voltage threshold Vop, the comparator 35b outputs the first voltage-value signal (light-emission-permitting signal) having the voltage value V1. When the value of the light-emitting voltage VLD is less than the voltage threshold Vop, a second voltage value signal having the voltage value V2 is outputted.

The voltage value V2 of the second voltage value signal is smaller than the voltage value V1 of the first voltage-value signal (V2<V1). The voltage value V2 is also smaller than the driving threshold Vd of the LD driver 21 (V2<Vd).

The voltage values of the first directing signal, the first fluctuation signal, and the first voltage-value signal all have the same value V1 in the present embodiment in order to facilitate understanding of the operation of the LD-destruction-preventing circuit 30. Additionally, the voltage values of the second directing signal, the second fluctuation signal, and the second voltage value signal all have the same value V2.

The AND circuit part 36 has a first diode 36a (first rectifier element), a second diode 36b (one of the second rectifier elements), a third diode 36c (one of the second rectifier elements), a pull-up resistor element R, and a standard power source 36d. The cathode of the first diode 36a is connected to the first output terminal part 37a of the main LSI 37. The cathode of the second diode 36b is connected to the second output terminal part 37b of the main LSI 37. The cathode of the third diode 36c is connected to the output side of the comparator 35b. The anodes of the first through third diodes 36a through 36c are connected to the LD driver 21. The standard power source 36d is connected via the pull-up resistor element R to a conductive pathway between the anodes of the first through third diodes 36a through 36c and the LD driver 21. The standard power source 36d imparts the standard potential Vr to the anodes of the first through third diodes 36a through 36c.

The standard potential Vr is lower than the voltage value V1 of the first directing signal, the first fluctuation signal, the first voltage-value signal and is higher than the voltage value V2 of the second directing signal, the second fluctuation signal, and the second voltage value signal. The [standard potential Vr] is also greater than or equal to the driving threshold Vd for using the LD driver 21 to cause the LD 11 to emit light. In cases where signals having the voltage value V1 are outputted from the first output terminal part 37a, the second output terminal part 37b, and the comparator 35b of the main LSI 37, the anodes of the first through third diodes 36a through 36c are held to the standard potential Vr so that the anode potentials of the first through third diodes 36a through 36c are lower than the cathode potentials. The voltage value of the light-emission control signal inputted to the LD driver 21 therefore has the same value as the standard voltage Vr, which is greater than or equal to the driving threshold Vd of the LD driver 21. Therefore, the LD driver 21 supplies driving power to the LD 11 and causes the LD 11 to emit light.

However, in cases where a signal having the voltage value V2 is outputted from at least one of the first output terminal part 37a, the second output terminal part 37b, and the comparator 35b of the main LSI 37, at least one of the first through third diodes 36a through 36c is conductive. The anode potentials of the first through third diodes 36a through 36c are therefore lower than the standard potential Vr, and the voltage value of the light-emission control signal inputted to the LD driver 21 is also lower than the standard potential Vr. When, e.g., the second voltage value signal having the voltage value V2 is outputted from the comparator 35b, the cathode potential of the third diode 36c is lower than the anode potential, and therefore the third diode 36c is conductive. The anode potential of the third diode 36c is then smaller than Vr, and therefore the light-emission control signal having a voltage value lower than the standard potential Vr is inputted to the LD driver 21. When the voltage value of the light-emission control signal inputted to the LD driver 21 is lower than the driving threshold Vd of the LD driver 21, the LD driver 21 stops the supply of driving power to the LD 11, and the LD 11 is stopped from emitting light. This operation occurs in the same manner in cases where the second directing signal having the voltage value V2 is outputted from the first output terminal part 37a of the main LSI 37 and in cases where the second fluctuation signal having the voltage value V2 is outputted from the second output terminal part 37b.

According to the LD-destruction-preventing circuit 30 of the present embodiment, in cases where the magnitude of the fluctuation component ΔVLD of the light-emitting voltage VLD is less than or equal to the fluctuation threshold ΔVs, which is set in advance, and the value of the light-emitting voltage VLD of the LD 11 supplied from the LD power source 22 is greater than or equal to the voltage threshold Vop, which is determined in advance, the LD 11 can be made to emit light according to the first directing signal for directing the LD 11 to emit light. In other words, in cases where the value of the light-emitting voltage VLD is smaller than the voltage threshold Vop, or the magnitude of the fluctuation component ΔVLD of the light-emitting voltage VLD is larger than the fluctuation threshold ΔVs, the light emission of the LD 11 resulting from the LD driver 21 can be stopped even when, e.g., light emission of the LD 11 has been directed by the first directing signal for causing the LD 11 to emit light for writing information to the optical disc 2 or reading information from the optical disc 2. Light emission of the LD 11 can therefore be stopped immediately even when the light-emitting voltage VLD supplied from the LD power source 22 suddenly fluctuates more rapidly than the optical output control of the LD 11 resulting from the LD driver 21. The optical output control of the LD 11 can therefore be prevented from becoming unmanageable, and destruction of the LD 11 can be prevented.

In order to facilitate understanding of the operation of the LD-destruction-preventing circuit 30 in the aforedescribed embodiment, the voltage values of the first directing signal, the first fluctuation signal, and the first voltage-value signal were all set to the same value V1, and the voltage values of the second directing signal, the second fluctuation signal, and the second voltage value signal were all set to the same value V2, but these examples are not given by way of limitation. The voltage values of these signals may also be different. In such cases, the standard potential Vr that is applied from the standard power source 36d should be less than the voltage values of the first directing signal, the first fluctuation signal, and the first voltage-value signal, greater than the voltage values of the second directing signal, the second fluctuation signal, and the second voltage value signal, and greater than or equal to the driving threshold Vd for using the LD driver 21 to cause the LD 11 to emit light.

In the aforedescribed embodiment, the control circuit part 31 and the voltage-fluctuation-monitoring circuit part 34 are implemented using a partial function of a main LSI 37 that is a microcomputer or the like, but this example is not given by way of limitation. The control circuit part 31 and at least a part of the voltage-monitoring circuit part 32 may be provided to a single main LSI 37. In such instances, a microcomputer can be used to direct starting and stopping of light emission by the LD 11 and to monitor the light-emitting voltage VLD, and therefore manufacturing costs can be reduced.

As a modification of the aforedescribed embodiment, the optical pickup part 10 may have a plurality of the LDs 11. The optical pickup part 10 may have, e.g., a first LD for BDs for emitting blue light and a second LD for DVDs or CDs for emitting red or infrared light. In such cases, the first LD for BDs and the second LD for DVDs and CDs have different operating voltages. Therefore, a power source for supplying to the LD driver 21 a light-emitting voltage VLDa for causing the first LD for BDs to emit light, and a power source for supplying to the LD driver 21*a* light-emitting voltage VLDb for causing the second LD for DVDs and CDs to emit light must be provided. The first LD for BDs and the second LD for DVDs and CDs may be controlled using a single LD driver 21. Alternatively, a first LD driver for controlling the light emission of the first LD for BDs and a second LD driver for controlling the light emission of the second LD for DVDs and CDs may be provided separately.

The present invention was described above on the basis of embodiments. These embodiments are given by way of example. Various modifications in the combinations of configurational elements and processes are possible, and it shall be apparent to a person of ordinary skill in the art that these modifications fall within the scope of the present invention.

The present invention can be used in optical disc devices and the like having APC functionality for adjusting the starting and stopping of light emission, and the optical output of semiconductor laser elements.

What is claimed is:

1. A circuit for preventing destruction of a semiconductor laser element, comprising:
   a light-emission-directing circuit part for outputting a light-emission-directing signal for directing the semiconductor laser element to emit light;
   a voltage-monitoring circuit part for monitoring a light-emitting voltage and, when a judgment is made that the light-emitting voltage is normal, outputting a light-emission-permitting signal for permitting the semiconductor laser element to emit light, the light-emitting voltage being supplied from a power source for the semiconductor laser element to an optical-output-controlling circuit part in order to cause the semiconductor laser element to emit light; and
   a light-emission-permitting circuit part for using the optical-output-controlling circuit part to cause the semiconductor laser element to emit light only when the light-emission-directing signal and the light-emission-permitting signal are inputted.

2. The circuit for preventing destruction of a semiconductor laser element according to claim 1, wherein the voltage-monitoring circuit part outputs the light-emission-permitting signal when a judgment is made that at least one of a voltage value of the light-emitting voltage and a magnitude of a fluctuation component of the voltage value is normal.

3. The circuit for preventing destruction of a semiconductor laser element according to claim 1, wherein the light-emission-permitting circuit part comprises:
   a first rectifier element, a cathode of the first rectifier element being connected to an output end of the light-emission-directing circuit part;
   at least one second rectifier element, a cathode of the second rectifier element being connected to an output end of the voltage-monitoring circuit part; and
   a standard power source for imparting a standard potential to anodes of the first and second rectifier elements via a pull-up resistor element, wherein
   the anodes of the first and second rectifier elements are connected to the optical-output-controlling circuit part;
   the light-emission-directing circuit part causes the first rectifier element to be conductive when the semiconductor laser element is directed to stop emitting light; and
   the voltage-monitoring circuit part causes the second rectifier element to be conductive when a judgment is made that at least one of the voltage value of the light-emitting voltage and the magnitude of the fluctuation component is abnormal.

4. The circuit for preventing destruction of a semiconductor laser element according to claim 1, wherein the light-emission-directing circuit part and at least one part of the voltage-monitoring circuit part is provided to a single microcomputer.

5. The circuit for preventing destruction of a semiconductor laser element according to claim 1, wherein the voltage-monitoring circuit part judges that the voltage value of the light-emitting voltage is normal when the voltage value of the light-emitting voltage is greater than or equal to a minimal operating voltage value required to cause the semiconductor laser element to emit light.

6. An optical disc device, comprising:
   an optical pickup part having a semiconductor laser element;
   an optical-output-controlling circuit part for controlling an optical output of the semiconductor laser element;
   a power source for the semiconductor laser element, the power source supplying to the optical-output-controlling circuit part a light-emitting voltage for causing the semiconductor laser element to emit light; and
   a circuit for preventing destruction of the semiconductor laser element, the circuit having the following:
   a light-emission-directing circuit part for outputting a light-emission-directing signal for directing the semiconductor laser element to emit light;
   a voltage-monitoring circuit part for monitoring the light-emitting voltage and, when a judgment is made that the light-emitting voltage is normal, outputting a light-emission-permitting signal for permitting the semiconductor laser element to emit light, the light-emitting voltage being supplied from the power source for the semiconductor laser element to the optical-output-controlling circuit part in order to cause the semiconductor laser element to emit light; and
   a light-emission-permitting circuit part for using the optical-output-controlling circuit part to cause the semiconductor laser element to emit light only when the light-emission-directing signal and the light-emission-permitting signal are inputted.

\* \* \* \* \*